(12) United States Patent
Schubert et al.

(10) Patent No.: US 8,975,614 B2
(45) Date of Patent: Mar. 10, 2015

(54) WAVELENGTH CONVERTERS FOR SOLID STATE LIGHTING DEVICES, AND ASSOCIATED SYSTEMS AND METHODS

(75) Inventors: Martin F. Schubert, Boise, ID (US); Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 414 days.

(21) Appl. No.: 13/215,998

(22) Filed: Aug. 23, 2011

(65) Prior Publication Data
US 2013/0050810 A1     Feb. 28, 2013

(51) Int. Cl.
| H01L 31/00 | (2006.01) |
| H01L 33/26 | (2010.01) |
| H01L 33/50 | (2010.01) |
| H01L 33/08 | (2010.01) |

(52) U.S. Cl.
CPC .............. *H01L 33/26* (2013.01); *H01L 33/502* (2013.01); *H01L 33/08* (2013.01)
USPC .......................... 257/14; 257/80; 257/E33.061

(58) Field of Classification Search
USPC ....................................... 257/80, E33.061, 14
See application file for complete search history.

(56) References Cited

U.S. PATENT DOCUMENTS

| 3,526,801 A | | 9/1970 | Kruse | |
| 5,703,379 A | | 12/1997 | Le Person et al. | |
| 5,708,674 A | * | 1/1998 | Beernink et al. | 372/50.12 |
| 6,148,014 A | * | 11/2000 | Geels et al. | 372/46.01 |
| 8,779,412 B2 | * | 7/2014 | Han et al. | 257/14 |
| 2002/0008244 A1 | | 1/2002 | Hommel et al. | |
| 2002/0139984 A1 | * | 10/2002 | Sugawara et al. | 257/79 |
| 2006/0124917 A1 | * | 6/2006 | Miller et al. | 257/13 |
| 2006/0124918 A1 | * | 6/2006 | Miller et al. | 257/14 |
| 2007/0045609 A1 | | 3/2007 | Saxler | |
| 2009/0261372 A1 | * | 10/2009 | Ueda | 257/98 |
| 2010/0314605 A1 | | 12/2010 | Khan | |
| 2010/0314650 A1 | | 12/2010 | Sugimori | |
| 2011/0101403 A1 | | 5/2011 | Haase et al. | |

(Continued)

FOREIGN PATENT DOCUMENTS

| WO | 02097902 A1 | 12/2002 |
| WO | 2010129412 A1 | 11/2010 |

OTHER PUBLICATIONS

International Search Report and Written Opinion issued Feb. 25, 2013 in International Application No. PCT/US2012/050118, 13 pages.

(Continued)

*Primary Examiner* — Matthew W Such
*Assistant Examiner* — Samuel Lair
(74) *Attorney, Agent, or Firm* — Perkins Coie LLP

(57) ABSTRACT

Wavelength converters for solid state lighting devices, and associated systems and methods. A system in accordance with a particular embodiment includes a solid state radiative semiconductor structure having a first region and a second region. The first region is positioned to receive radiation at a first wavelength and has a first composition and an associated first bandgap energy. The second region is positioned adjacent to the first region to receive energy from the first region and emit radiation at a second wavelength different than the first wavelength. The second region has a second composition different than the first composition, and an associated second bandgap energy that is less than the first bandgap energy.

19 Claims, 7 Drawing Sheets

(56) References Cited

U.S. PATENT DOCUMENTS

2011/0121319 A1 5/2011 Haase et al.
2013/0049569 A1* 2/2013 Schubert et al. ............. 313/483

OTHER PUBLICATIONS

3M Claims Record Efficacy for Green LED, LEDs Magazine, Nov. 23, 2009, 2 pages, retrieved from the Internet, URL: http://www/ledsmagazine.com/news/6/11/24.

3M Thermal Management Solutions for LED Assembly, 2 pages, Dec. 2010, retrieved from the Internet, URL: http://multimedia.3m.com/mws/mediawebserver?mwsId=SSSSSu7zK1fslxtUOY_9lYtvev7qe17zHvTSevTSeSSSSSS--&fn=ThermalLED_DMR_6004858.pdf.

Eissler, D. et al., LED Technology Trends, The International Conference on Compound Semiconductor Manufacturing Technology, Apr. 2005, 4 pages, retrieved from the Internet, URL: www.csmantech.org/Digests/2005/2005papers/6.1.pdf.

Heliotis, G. et al., Hybrid Inorganic/Organic Semiconductor Heterostructures with Efficient Non-Radiative Energy Transfer, Advanced Materials, vol. 18, No. 3, pp. 334-338, Feb. 2006.

* cited by examiner

WAVELENGTH CONVERTERS FOR SOLID STATE LIGHTING DEVICES, AND ASSOCIATED SYSTEMS AND METHODS

TECHNICAL FIELD

The present technology is directed generally to wavelength converters for solid state lighting devices, and associated systems and methods. Wavelength converters in accordance with the present technology are suitable for LEDs and other radiation emitting devices.

BACKGROUND

Mobile phones, personal digital assistants ("PDAs"), digital cameras, MP3 players, and other portable electronic devices utilize solid state lighting ("SSL") devices (e.g., LEDs) for backlighting. SSL devices are also used for signage, indoor lighting, outdoor lighting, and other types of general illumination. FIG. 1A is a cross-sectional view of a conventional SSL device 10a with lateral contacts. As shown in FIG. 1A, the SSL device 10a includes a substrate 20 carrying an LED structure 11 having an active region 14, e.g., containing gallium nitride/indium gallium nitride (GaN/InGaN) multiple quantum wells ("MQWs"), positioned between N-type GaN 15 and P-type GaN 16. The SSL device 10a also includes a first contact 17 on the P-type GaN 16 and a second contact 19 on the N-type GaN 15. The first contact 17 typically includes a transparent and conductive material (e.g., indium tin oxide ("ITO")) to allow light to escape from the LED structure 11. In operation, electrical power is provided to the SSL device 10a via the contacts 17, 19, causing the active region 14 to emit light.

FIG. 1B is a cross-sectional view of another conventional LED device 10b in which the first and second contacts 17 and 19 are opposite each other, e.g., in a vertical rather than lateral configuration. During formation of the LED device 10b, a substrate 20, similar to the substrate 20 shown in FIG. 1A, initially carries an N-type GaN 15, an active region 14 and a P-type GaN 16. The first contact 17 is disposed on the P-type GaN 16, and a carrier 21 is attached to the first contact 17. The substrate 20 is removed, allowing the second contact 19 to be disposed on the N-type GaN 15. The structure is then inverted to produce the orientation shown in FIG. 1B. In the LED device 10b, the first contact 17 typically includes a reflective and conductive material (e.g., silver or aluminum) to direct light toward the N-type GaN 15.

One drawback with existing LEDs is that they do not emit white light. Instead, LEDs typically emit light within only a narrow wavelength range. For human eyes to perceive the color white, a broad range of wavelengths is needed. Accordingly, one conventional technique for emulating white light with LEDs is to deposit a converter material (e.g., a phosphor) on an LED die. FIG. 1C shows a conventional SSL device 10c that includes a support 2 carrying an LED die 4 and a converter material 6. In operation, an electrical voltage is applied to the die 4 via contacts having an arrangement generally similar to that shown in either FIG. 1A or FIG. 1B. In response to the applied voltage, the active region of the LED die 4 produces a first emission (e.g., a blue light) that stimulates the converter material 6 to emit a second emission (e.g., a yellow light). The combination of the first and second emissions appears white to human eyes if matched appropriately. As discussed in more detail below, using phosphor converter materials to "convert" blue light into white light has certain drawbacks. Accordingly, there is a need for light emitting devices that can produce light at a particular wavelength without phosphor converter materials.

BRIEF DESCRIPTION OF THE DRAWINGS

Many aspects of the present disclosure can be better understood with reference to the following drawings. The components in the drawings are not necessarily to scale. Instead, emphasis is placed on clearly illustrating the principles of the present disclosure. Moreover, in the drawings, like reference numerals designate corresponding parts throughout the several views.

DETAILED DESCRIPTION

Embodiments of the present disclosure are directed generally to wavelength converters for solid state lighting ("SSL") devices, and associated systems and methods. As used hereinafter, the term "SSL device" generally refers to devices with light emitting diodes ("LEDs"), organic light emitting devices ("OLEDs"), laser diodes ("LDs"), polymer light emitting diodes ("PLEDs"), and/or other suitable sources of illumination other than electrical filaments, a plasma, or a gas. Briefly described, a radiation system in accordance with a particular embodiment includes a solid state radiative semiconductor structure that has a first region and a second region. The first region is positioned to receive radiation at a first wavelength and has a first composition and associated first bandgap energy. The second region is positioned adjacent to the first region to receive optically generated carriers from the first region and emit radiation at second wavelength different than the first wavelength. The second region has a composition different than the first composition and an associated second bandgap energy as less than the first bandgap energy. The radiative semiconductor structure can be positioned proximate to an energy source that directs radiation at the first wavelength toward the first region of the semiconductor structure. In further particular embodiments, the energy source can include a solid state lighting device, for example, an LED.

Other systems, methods, features, and advantages of the presently disclosed technology will become apparent to one of ordinary skill in the art. Several details describing structures or processes that are well-known and often associated with such systems and methods, but that may unnecessarily obscure some significant aspects of the disclosure, are not set forth in the following description for purposes of clarity. Moreover, although the following disclosure sets forth several embodiments of different aspects of the technology disclosed herein, several other embodiments can include different configurations or different components than those described in this section. Accordingly, the disclosed technology may have other embodiments with additional elements, and/or without several of the elements described below with reference to FIGS. 2-7.

Figure 1A:
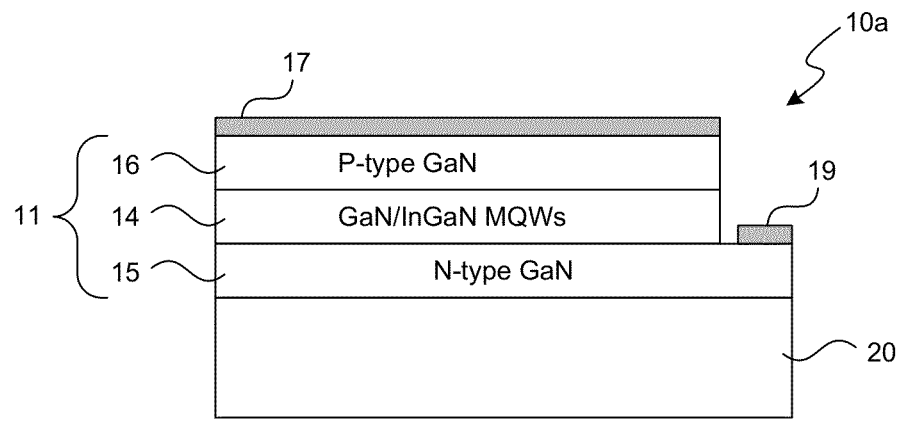
FIG. 1A is a schematic cross-sectional diagram of an SSL device having a lateral arrangement in accordance with the prior art.
Figure 1B:
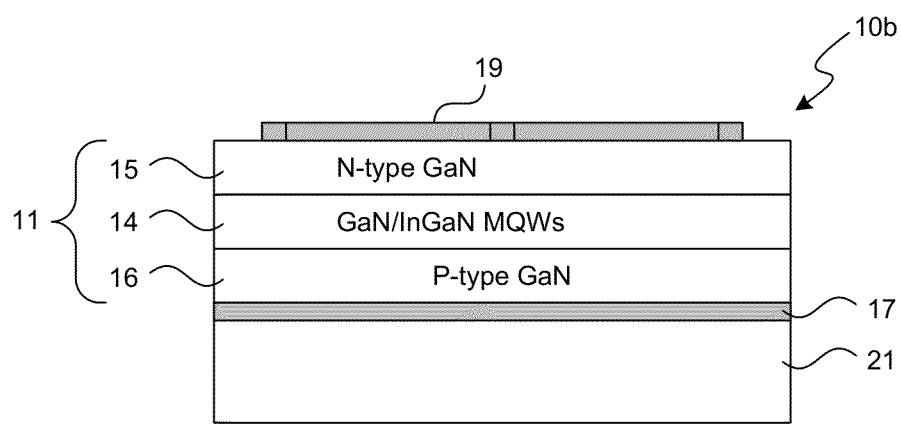
FIG. 1B is a schematic cross-sectional diagram of another SSL device having a vertical arrangement in accordance with the prior art.
Figure 1C:
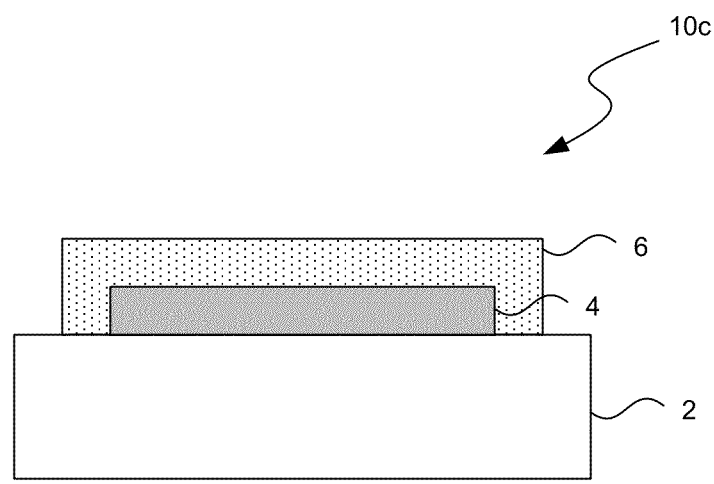
FIG. 1C is a schematic cross-sectional diagram of a light emitting device having a phosphor converter material positioned in accordance with the prior art.
Figure 2:
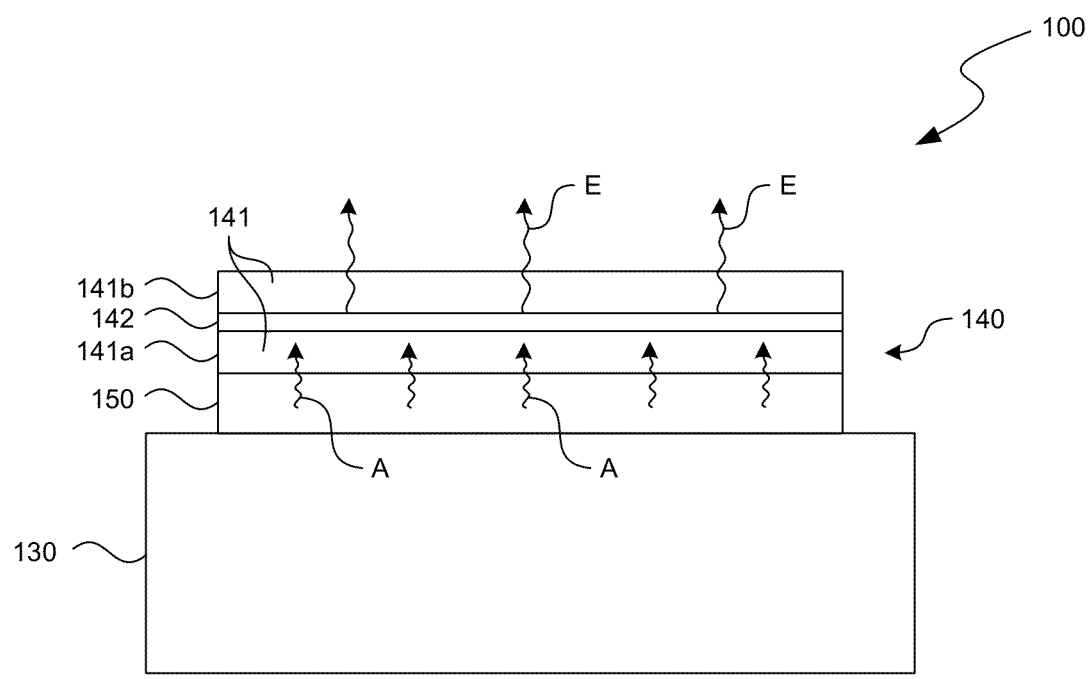
FIG. 2 is partially schematic, cross-sectional illustration of a system that includes a light source and a radiative structure configured in accordance with an embodiment of the present technology.

FIG. 2 is a partially schematic, cross-sectional illustration of a system 100 that receives or absorbs energy at one wavelength and re-radiates or emits energy at another wavelength. In a particular embodiment, the system 100 includes a support 130 carrying a light source 150. The light source 150 can include an LED or other SSL device, or other devices (e.g., a laser) that emit first radiation at a first wavelength A. The system 100 further includes a radiative structure 140 positioned to receive and absorb the first radiation and emit second radiation at a different wavelength E. The radiative structure 140 can include one or more first regions 141 (e.g., absorptive regions) and one or more second regions 142 (e.g., emissive regions). For example, in the embodiment shown in FIG. 2, the radiative structure 140 includes two absorptive regions 141, shown as a first absorptive region 141a and a second absorptive region 141b, positioned on opposite sides of a single emissive region 142. As used herein, the term "absorptive region" refers generally to a region having suitable (e.g., strong) absorptive characteristics at the first wavelength A emitted by the light source 150. The term "emissive region" refers generally to a region having suitable (e.g., strong) emissive characteristics at the second wavelength E. In any of these embodiments, the radiative structure 140 can replace conventional phosphor structures and can accordingly modify the spectrum of light emitted by overall system 100 without the use of phosphors, or with a reduced use of phosphors. Further features and advantages of representative systems are described below with reference to FIGS. 3A-7.

Figure 3A:
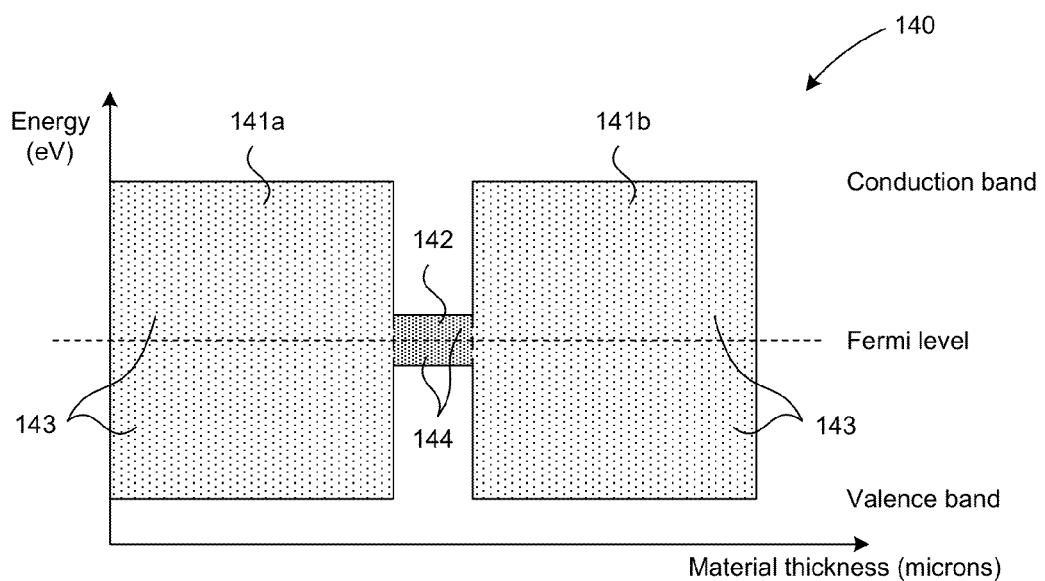
FIG. 3A is a bandgap graph of energy level as a function of material thickness for a radiative structure configured in accordance with an embodiment of the present technology.

FIG. 3A is a bandgap diagram illustrating energy (in electron volts, eV) as a function of material thickness (in microns) for a representative radiative structure 140 generally similar to that shown in FIG. 2. For reference, the Fermi level, conduction band and valence band for the radiative structure 140 are also shown in FIG. 3A. As described above, the radiative structure 140 includes first and second absorptive regions 141a, 141b, and an emissive region 142 in between. The absorptive regions 141a, 141b correspond to carrier-generating regions and can accordingly generate electrons and holes in response to receiving incoming radiation. The difference in thickness and bandgap (e.g., the energy separation between conduction and valence band) between the absorptive and emissive regions result in a higher carrier concentration and better carrier wavefunction overlap in the emitting region and therefore, higher radiative efficiency in that region. In particular, the relatively lower conduction band edge in the emissive region 142 as compared to the absorptive regions 141a and 141b makes it energetically favorable for optically generated electrons in the conduction band of the absorptive regions 141a and 141b to collect within the emissive region 142, thereby lowering the density of electrons in the absorptive regions 141a and 141b and increasing the electron density in the emissive region 142. Similarly, the relatively higher valence band edge in the emissive region 142 compared to the absorptive regions 141a and 141b makes it energetically favorable for optically generated holes to collect within the emissive region 142, thereby lowering the density of holes in the absorptive regions 141a and 141b, and increasing it in the emissive region 142. The higher density of electrons and holes in the emissive region 142 yields an increased radiative recombination rate in the emissive region 142 as compared to the absorptive regions 141a and 141b.

In particular embodiments, the materials selected for the absorptive regions 141 and the emissive region 142 are selected to enhance the efficiency with which the radiative structure 140 converts energy from one wavelength to another. In particular, the first regions 141 include a first material 143 that is selected to have high absorptivity at the first wavelength A emitted by the light source 150 (FIG. 2). The second region 142 is selected to include a second material 144 that preferentially emits energy at the second wavelength E. In addition, the first material 143 and the second material 144 are selected to produce an energy level gradient that drives or otherwise moves electrons and holes from the first regions 141 to the second region 142. This in turn increases the density of electrons and holes at the second region 142, which in turn increases the recombination rate of electrons and holes at this region and therefore the amount of energy emitted by the emissive region 142.

Figure 3B:
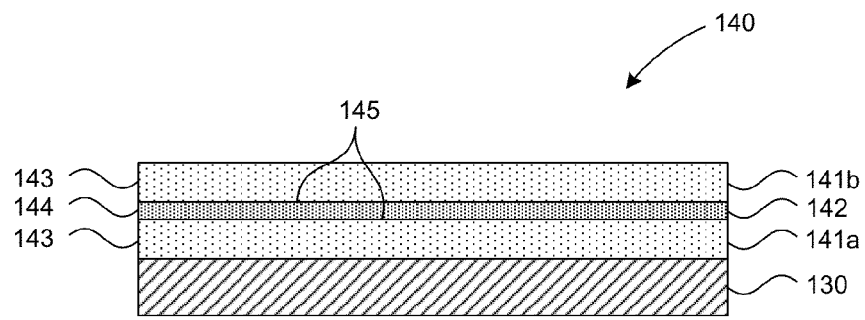
FIG. 3B is a partially schematic, cross-sectional illustration of a radiative structure having bandgap characteristics generally similar to those shown in FIG. 3A.

FIG. 3B is a partially schematic, cross-sectional illustration of a representative radiative structure 140 having bandgap characteristics generally similar to those described above with reference to FIG. 3A. The radiative structure 140 includes a support 130 and an emissive region 142 sandwiched between two absorptive regions 141a, 141b. The first material 143 can be selected to include a semiconductor material, for example, aluminum gallium phosphide (AlGaP) which can be selected to absorb radiation at the first wavelength A (FIG. 2). The second material 144 can also include a semiconductor material, for example, aluminum indium gallium phosphide (AlInGaP) which is selected for its emissive characteristics. The constituents selected for the first material 144 depend in part on the target wavelength for the absorbed and emitted radiation. For example, the first material 143 can include an aluminum indium gallium alloy with about 10-15% indium to preferentially absorb blue light. The second material 144 can include an aluminum indium gallium alloy with about 20-30% indium to emit green/yellow light.

In another embodiment, both absorptive and emissive regions include AlInGaP material, with different concentrations of Al and Ga, and the same concentration of In (e.g., around 50% of the Group-III materials). Such an alloy could be deposited so as to be lattice matched to a GaAs substrate, which would result in low defectivity and high radiation efficiency.

The first and second materials 143, 144 can be disposed on the substrate 130 in the form of layers using existing semiconductor processing techniques, including, but not limited to molecular beam epitaxy (MBE), methyl-organic chemical vapor deposition (MOCVD) or metal-organic vapor-phase epitaxy (MOVPE). The higher bandgap energy portions of the structure 140 associated with the absorptive regions 141a, 141b can be located at interfaces 145 (e.g., surface-to-surface interfaces) adjacent to the emissive region 142. In particular embodiments, the material layers can be disposed on a transparent support 130 so that the entire assembly, including the support 130 can be attached to or positioned proximate to the corresponding light source from which the radiative structure 140 receives energy. In other embodiments, the support 130 can take the form of a releasable and/or sacrificial carrier that is separated from the rest of the radiative structure 140 before or after the structure 140 is positioned relative to the corresponding light source. Suitable carriers can be formed from gallium arsenide, sapphire, silicon, silicon carbide, and/or aluminum nitride. In still further embodiments, the SSL device structure and the radiative structure 140 can be formed integrally in a series of epitaxial growth steps. For example, the radiative structure 140 can be epitaxially grown on a suitable substrate and the SSL device structure can be formed directly on the radiative structure 140 via a series of additional epitaxial growth steps. In other embodiments, the SSL device structure can be formed first and the radiative structure can be epitaxially grown on it.

The radiative structure 140 can be attached to the corresponding light source using any of a variety of suitable bonding techniques that provide support between the radiative structure 140 and the light source without unnecessarily impeding radiation energy transmitted from the light source to the radiative structure 140. For example, the light source 150 and the radiative structure 140 can each include an oxide layer, and the corresponding oxide layers can be bonded to each other using an oxide-oxide bonding process. Such processes are well-known in the art of semiconductor manufacturing.

One feature of the forgoing embodiments described above with reference to FIG. 2-3B is that the radiative structures can absorb energy at one wavelength and re-emit the energy at a different wavelength, without the use of phosphor. One advantage of this arrangement is that phosphor tends to be a poor thermal conductor. As a result, the phosphor can restrict the rate at which heat, generated by the light source, is conducted, convected or otherwise transmitted away from the light source. Poor heat transfer can in turn degrade the performance and/or life expectancy of the light source. By contrast, the semiconductor materials described above as components of the radiative structure 140 can more readily conduct heat away from the light source and can accordingly improve the performance and/or longevity of the light source.

Another feature of the embodiments described above is that the functions of absorbing radiation and emitting radiation are split between different materials and different regions. This allows the manufacturer to make the emissive region 142 relatively thin. The thin emissive region 142 accordingly results in a higher density of electrons and holes than does a thicker region and can therefore emit radiation with a greater intensity and/or efficiency than does a thicker region. The emissive region 142 does not absorb a large portion of radiation due to its small thickness, however this does not adversely affect the rate at which electrons and holes are delivered to the emissive region 142. Instead, this function is provided by the absorptive regions 141a, 141b, which include materials selected to produce an energy gradiant that drives electrons and holes toward the emissive region 142, and which have thicknesses selected to enhance the absorptive function these regions perform.

Figure 4A:
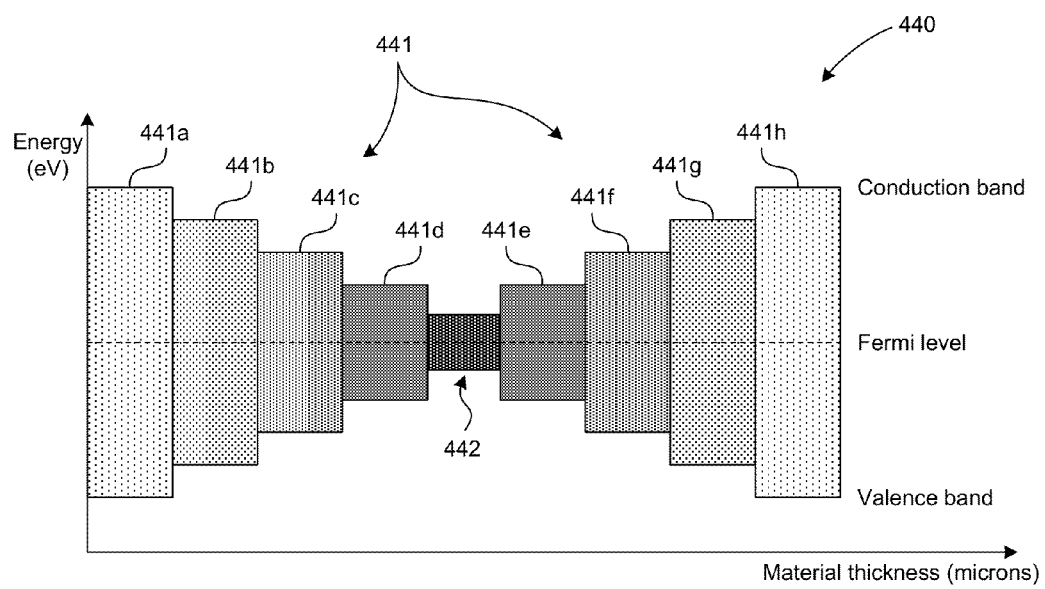
FIG. 4A is a bandgap graph of energy level as a function of material thickness for a radiative structure having stepped absorption regions in accordance with an embodiment of the present technology.

FIGS. 4A-7 illustrate further embodiments of radiative structures having absorptive regions and emissive regions with different material compositions and different associated bandgap energy levels. For example, FIG. 4A is a graph illustrating the bandgap energy level as a function of material thickness for a radiative structure 440 having multiple stepped absorptive regions 441. In a particular embodiment, the radiative structure 440 includes eight absorptive regions 441 (indicated individually as absorptive regions 441a-441h), with four positioned on each of two opposing sides of a corresponding emissive region 442. However, the disclosed technology is not limited to any particular number of absorptive or emissive regions. Each absorptive region 441 has a material composition that produces a corresponding bandgap energy that is stepped relative to its neighbor(s). In a particular embodiment, the material comprising each of the absorptive regions 441 can include aluminum indium gallium phosphide, with an amount of one or more of these constituents varying from one absorptive region 441 to the next. For example, the amount of indium in the absorptive regions can vary from zero or a relatively small amount at the outer absorptive regions 441a, 441h to a maximum amount at the inner emissive regions 441d, 441e. In other embodiments, other constituents of the aluminum indium gallium phosphide alloy (for example, aluminum and gallium) can be varied to produce other graduated bandgap arrangements. In still further embodiments, the material comprising the absorptive regions 441 and/or the emissive region 442 can include other elements and/or other alloys. For example, the material can include aluminum indium gallium nitride in one such embodiment, and in other embodiments, can include alloys of elements other than aluminum and gallium. In any of these embodiments, the materials selected for the absorptive regions 441 and the emissive region 442 are generally selected to provide a bandgap energy gradiant that drives electrons and/or holes from the absorptive regions 441 to the emissive region 442 in a manner generally similar to that described above with reference to FIGS. 3A-3B.

Figure 4B:
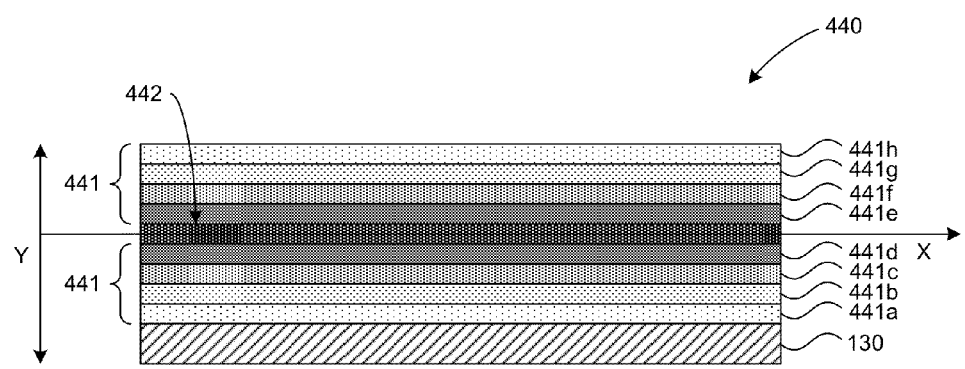
FIG. 4B is a partially schematic, cross-sectional illustration of a radiative structure having bandgap characteristics generally similar to those shown in FIG. 4A.

FIG. 4B is a partially schematic, cross-sectional illustration of a representative radiative structure 440 having bandgap characteristics generally similar to those described above with reference to FIG. 4A. The radiative structure 440 can include layers of material that form each of the absorptive regions 441a-441h, as well as the emissive region 442. Individual regions are positioned adjacent to each other along a Y axis (e.g., a thickness axis) and the materials forming the absorptive regions 441a-441h are selected to produce successively narrower bandgap energies in a direction toward the emissive region 442. In particular embodiments, individual absorptive regions 441 on opposite sides of the emissive region 442 are symmetric about an X axis passing through the emissive region 442. The materials forming the emissive region 442 and the absorptive regions 441 can be disposed on a support 130 using any of the techniques described above with reference to FIG. 3B.

Figure 5A:
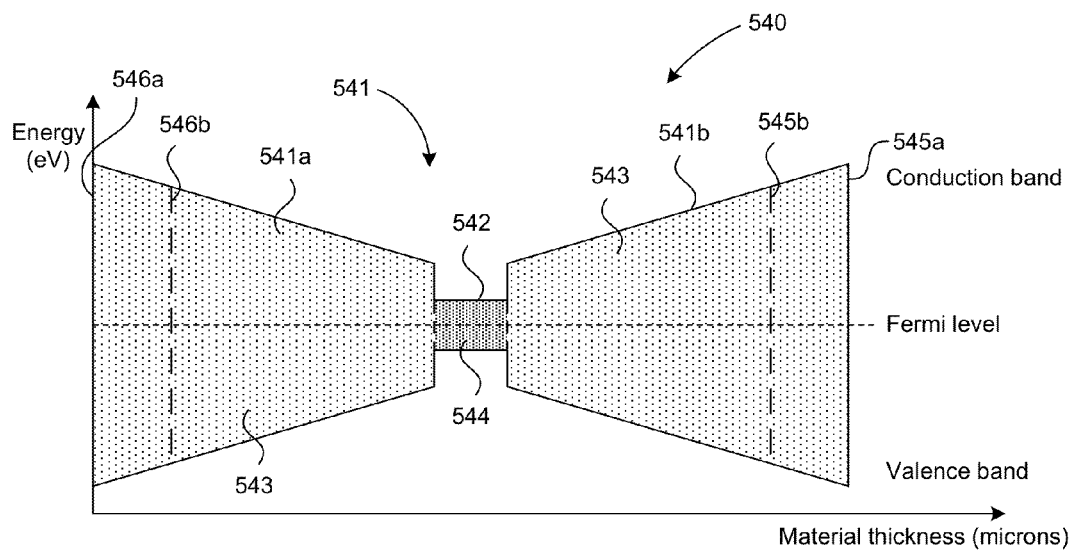
FIG. 5A is a bandgap graph of energy level as a function of material thickness for a radiative structure having a continuously varying absorption region in accordance with an embodiment of the present technology.

FIG. 5A is a bandgap graph for a radiative structure 540 having multiple absorptive regions 541 (shown as first and second absorptive regions 541a, 541b) with continuously varying bandgap energies in accordance with another embodiment of the technology. For example, each of the absorptive regions 541 can include a first material 543 having a continuously varying amount of indium in an aluminum indium gallium phosphide alloy. The corresponding emissive region 542 can include a second material 544 having a higher concentration of indium. In a particular embodiment, the second material 544 can have a step change in the indium concentration relative to the adjacent absorptive regions 541a, 541b. In another embodiment, the concentration of indium (or another element of the alloy) can be the same in the emissive region 542 as it is in the immediately adjacent portions of the absorptive regions 541a, 541b. In either embodiment, the emissive region 542 forms an energy valley or well relative to the surrounding regions, thereby forcing electrons and holes to relax to the bottom of the energy well, producing a higher carrier density, which in turn increases the recombination rate and radiation emission rate at the emissive region 542.

The radiative structure 540 includes an outer edge 545a positioned apart from the emissive region 542, and a corresponding inner edge 546a. In operation, the inner edge 546a is positioned to face toward the light source 150 (FIG. 2) and the outer edge 545a is positioned to face away from the light source 150. In one aspect of this embodiment, the outer edge 545a and the inner edge 546a are located equidistant from the emissive region 542. In other embodiments, the radiative structure 540 can instead include an outer edge 545b (shown in dashed lines) located closer to the emissive region 542 than is the inner edge 546a. Such an arrangement can be used in contexts for which it is desirable to have more absorptive material on one side of the emissive region 542 than on the other. For example, when the light source 150 (FIG. 2) is positioned adjacent to the inner edge 546a, it may be desirable to have more material in the first absorptive region 541a than in the second absorptive region 541b. In the limit, the second absorptive region 541b can be eliminated entirely. In still another embodiment, the second absorptive region 541b can be thicker than the first absorptive region 541a as indicated by an inner edge 546b shown in dashed lines. For example, in at least some cases, the first absorptive region 541b may produce electrons and holes at a greater rate than does the second absorptive region 541b by virtue of its closer proximity to the light source. By making the first absorptive region 541a thinner than the second absorptive region 541b, the rate at which both regions produce electrons and holes can be equalized or approximately equalized, and the emissive region 542 can accordingly receive electrons and holes from both regions 541a, 541b at roughly equal rates, which can improve the efficiency with which the radiative structure 540 emits energy.

Figure 5B:
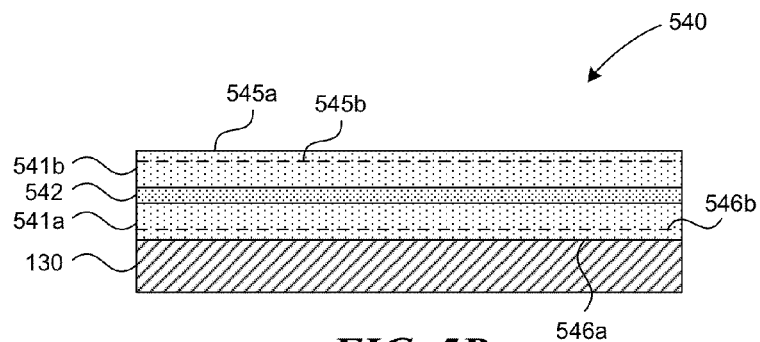
FIG. 5B is a partially schematic, cross-sectional illustration of a radiative structure having bandgap characteristics generally similar to those described above with reference to FIG. 5A.

FIG. 5B is a partially schematic, cross-sectional illustration of a representative radiative structure 540 having bandgap characteristics generally similar to those described above with reference to FIG. 5A. The composition of a first material 543 in the first regions 541a, 541b can be varied in a generally continuous manner, for example, by varying the concentration of constituents introduced into a chemical vapor deposition chamber as the material is deposited on the support 130.

Figure 6:
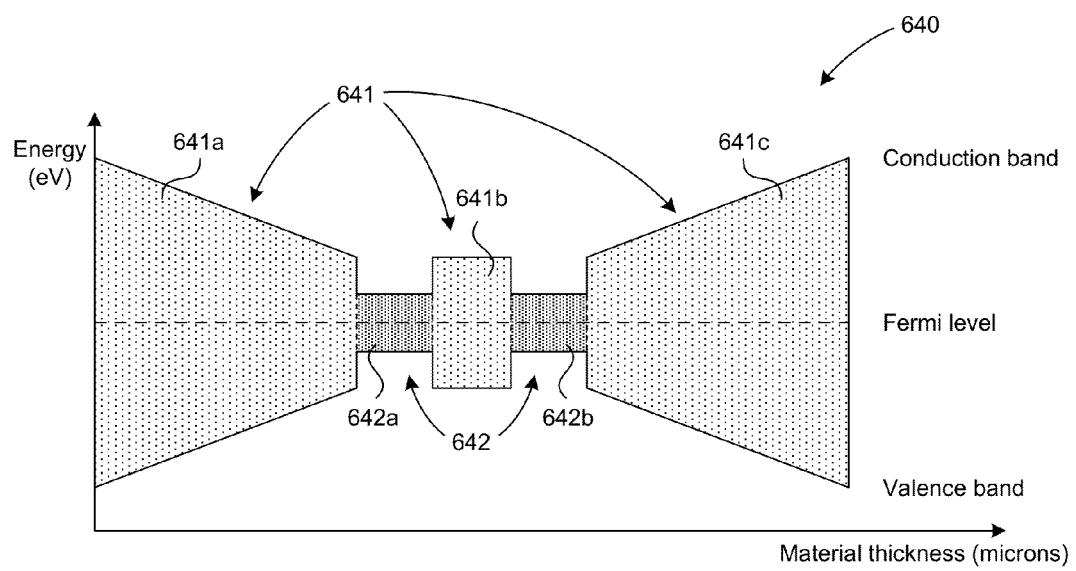
FIG. 6 is a bandgap graph of energy as a function of material thickness for a radiative structure having multiple emission regions in accordance with an embodiment of the present technology.

FIG. 6 is a graph illustrating bandgap energy as a function of material thickness for a radiative structure 640 having multiple emissive regions 642 in accordance with another embodiment of the disclosure. In this particular embodiment, the radiative structure 640 includes two emissive regions 642a, 642b positioned between corresponding first, second and third absorptive regions 641a, 641b, 641c. An advantage of this feature is that each emissive structure 642a, 642b can have a different composition and associated bandgap energy, and can accordingly emit radiation at a different wavelength. In this manner, a single structure can produce radiation at multiple wavelengths. This arrangement can be used to produce blended colors, for example, a blend that appears white to the human eye.

Another feature of an embodiment shown in FIG. 6 is that the manufacturer can control the carrier density of each of the emissive regions separately (and the carrier density in the structure overall) by controlling the number of emissive regions and the thickness of each emissive region. In particular embodiments, it may be desirable to form emissive regions that are very thin to avoid stresses that may result from lattice mismatches because such stresses can be increased if the material thickness is high. At the same time, it may be desirable to control the carrier density at the emissive regions not to be too high. Having multiple emissive regions allows the manufacturer the flexibility to optimize or approximately optimize multiple variables including those described above.

Figure 7:
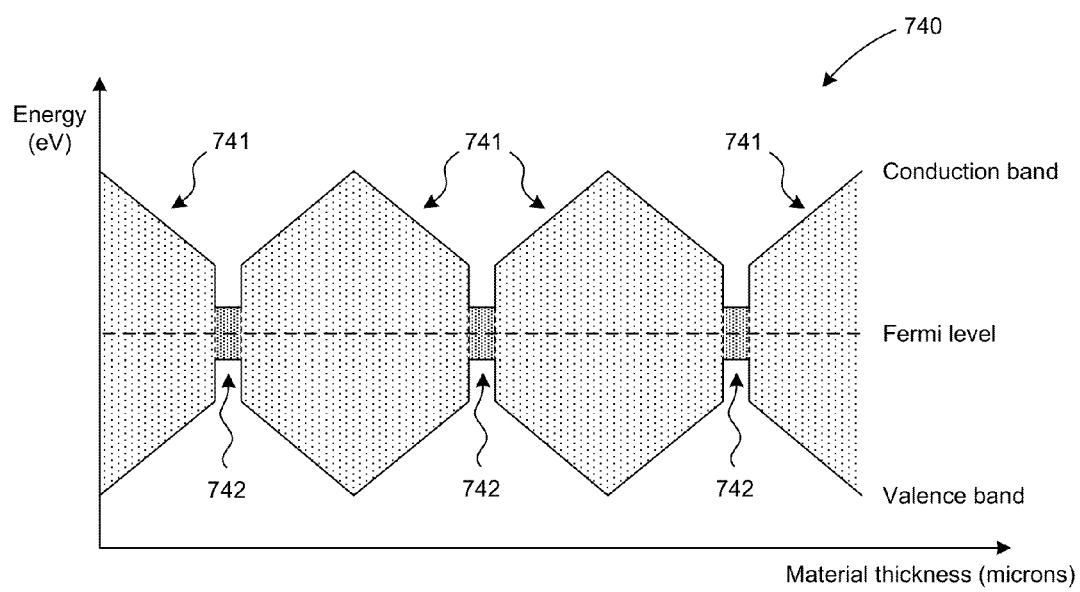
FIG. 7 is a bandgap graph of energy as a function of material thickness for a radiative structure having multiple emission and absorption regions in accordance with another embodiment of the technology.

FIG. 7 illustrates a bandgap energy graph for a radiative structure 740 having multiple absorptive regions 741 and multiple emissive regions 742 in accordance with still another embodiment of the technology. As described above with reference to FIG. 6, the multiple emissive regions 742 can provide advantages when compared with structures having a single emissive region. Conversely, an advantage of embodiments having a single emissive region is that they may be less expensive to manufacture.

From the foregoing, it will be appreciated that specific embodiments of the technology have been described herein for purposes of illustration, but that various modifications may be made without deviating from the disclosed technology. For example, representative bandgap graphs described above illustrate bandgaps converging toward the Fermi level from both the conduction band edge and the valence band edge. In other embodiments, the bandgaps can successively narrow, but with only the conduction edge converging, or only the valence edge converging, or with both the conduction and valence edges converging, but with different slopes. Certain embodiments of the technology were described in the context of particular materials (e.g., aluminum indium gallium phosphide and aluminum indium gallium nitride), but in other embodiments, other materials can be used to produce similar results. For example, other suitable materials may be selected from Group III and/or Group V of the periodic table of the elements. Certain embodiments of the technology were described above in the context of shifting the wavelength of visible light. In other embodiments similar structures and methods can be used to shift energy at other wavelengths.

Certain aspects of the technology described in the context of particular embodiments may be combined or eliminated in other embodiments. For example, the stepped arrangement of the absorptive regions described in the context of FIGS. 4A and 4B can be applied to radiative structures having multiple emissive regions such as was described above with reference to FIGS. 6 and 7. In other embodiments, stepped and continuously varying material characteristics can be combined in a single structure. Further, while advantages associated with certain embodiments have been described in the context of those embodiments, other embodiments may also exhibit such advantages, and not all embodiments need necessarily exhibit such advantages to fall within the scope of the present technology. Accordingly, the present disclosure and associated technology can encompass other embodiments not expressly shown or described herein.

We claim:
1. A radiation system, comprising:
   a solid state radiative semiconductor structure, having:
      a stack of at least three absorptive regions positioned to receive radiation at a first wavelength, the absorptive regions each having a corresponding composition and a corresponding associated bandgap energy that decreases step-wise from one absorptive region to its neighbor in a direction away from a source of the radiation; and an emissive region positioned adjacent to the absorptive regions to receive energy from the absorptive regions and emit radiation at a second wavelength different than the first wavelength, the emissive region having a composition different than the composition of any of the absorptive regions, and an associated bandgap energy that is less than the bandgap energies of the absorptive regions.

2. The system of claim 1 wherein the emissive region is positioned to receive electrons and holes from the absorptive regions.

3. The system of claim 1 wherein the bandgap energy within each absorptive region is generally constant.

4. The system of claim 1 wherein each absorptive region includes at least one alloy, and wherein a composition of the alloy varies along an axis transverse to the absorptive and emissive regions.

5. The system of claim 4 wherein the alloy includes an element from Group III and an element from Group V.

6. The system of claim 4 wherein the composition of the alloy varies in a generally continuous manner over at least a portion of the first region.

7. The system of claim 4 wherein the composition of the alloy is different in each absorptive region.

8. The system of claim 4 wherein the alloy includes at least one element at a first location along the axis that is not present at a second location along the axis.

9. The system of claim 4 wherein the alloy includes at least one element having a first concentration at a first location along the axis and a second concentration different than the first concentration at a second location along the axis.

10. The system of claim 1 wherein the stack of at least three absorptive regions is a first stack facing a first side of the emissive region, and wherein the emissive region has a second side facing away from the first side, the system further comprising a second stack of absorptive regions facing the second side of the emissive region.

11. The system of claim 1 wherein the first region is one of multiple first regions and wherein the second region is one of multiple second regions, and wherein individual second regions are positioned between and adjacent to individual first regions.

12. The system of claim 1 wherein a composition of the semiconductor structure has a step change at an interface between the emissive region and its neighbor absorptive region.

13. The system of claim 1, further comprising an energy source positioned to direct radiation at the first wavelength toward the absorptive regions of the semiconductor structure.

14. The system of claim 13 wherein the energy source includes a solid state lighting device.

15. The system of claim 13 wherein the energy source includes a laser.

16. The system of claim 1 wherein the emissive region is positioned to emit radiation at the second wavelength absent a phosphor material.

17. A solid state lighting (SSL) system, comprising:
an SSL device that includes:
an active region that emits light at a first wavelength;
an N-type material adjacent to the active region; and
a P-type material adjacent to the active region; and
a solid state, radiative semiconductor structure, including:
a stack of at least three absorptive regions positioned to receive light emitted from the active region at the first wavelength, each absorptive region having an absorptive region thickness along a thickness axis and an absorptive composition and associated absorptive bandgap energy, wherein the absorptive bandgap energy decreases step-wise from one absorptive region to its neighbor in a direction away from the active region; and
an emission region positioned adjacent to the absorptive regions to emit light at a second wavelength different than the first wavelength, the emission region having an emission region thickness along the thickness axis less than a sum of the thicknesses of the absorptive regions, an emissive composition different than each absorptive composition, and an associated emissive bandgap energy that is less than each absorptive bandgap energy of each absorptive region.

18. The system of claim 17 wherein the SSL is not positioned to direct light toward a phosphor.

19. The system of claim 17 wherein the absorptive regions include aluminum indium gallium phosphide, and wherein a concentration of indium in the absorptive regions is lower than a concentration of indium in the emission region.

* * * * *